US006444900B1

(12) United States Patent
Casey

(10) Patent No.: US 6,444,900 B1
(45) Date of Patent: Sep. 3, 2002

(54) ELECTROMAGNETIC INTERFERENCE SHIELDING GASKET

(75) Inventor: Daniel T. Casey, Harrisburg, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/314,508

(22) Filed: May 19, 1999

(51) Int. Cl.[7] .................................................. H05K 9/00

(52) U.S. Cl. ............................... 174/35 GC; 174/35 R; 361/818

(58) Field of Search ................................ 277/920, 919; 439/927, 939; 174/35 GC, 35 R; 361/818, 753, 816, 683, 686

(56) References Cited

U.S. PATENT DOCUMENTS

| | | | | |
|---|---|---|---|---|
| 3,312,769 A | | 4/1967 | Kaff | 174/35 |
| 3,336,560 A | | 8/1967 | Myers | 339/14 |
| 3,366,918 A | | 1/1968 | Johnson et al. | 339/143 |
| 3,573,716 A | | 4/1971 | Garver | 339/128 |
| 3,711,817 A | | 1/1973 | Carter et al. | 339/121 |
| 4,148,542 A | | 4/1979 | Wood | 339/126 RS |
| 4,156,804 A | | 5/1979 | Piber | 200/296 |
| 4,212,510 A | | 7/1980 | Ritchie et al. | 339/147 |
| 4,241,972 A | | 12/1980 | Ayer | 339/126 R |
| 4,386,814 A | | 6/1983 | Asick | 339/14 R |
| 4,394,960 A | | 7/1983 | Nakazawa | 237/12.3 C |
| 4,498,715 A | | 2/1985 | Peppler | 339/14 R |
| 4,623,752 A | | 11/1986 | Steen et al. | 174/35 GC |
| 4,688,868 A | | 8/1987 | Noyes | 439/108 |
| 4,705,916 A | | 11/1987 | Wadhera et al. | 174/35 GC |
| 4,708,412 A | | 11/1987 | Himes, Jr. et al. | 439/95 |
| 4,761,144 A | | 8/1988 | Hunt, III et al. | 439/545 |
| 4,781,603 A | | 11/1988 | Olsson et al. | 439/95 |
| 4,781,626 A | | 11/1988 | Lazarchik | 439/680 |
| 4,824,387 A | | 4/1989 | deJong et al. | 439/248 |
| 4,923,310 A | | 5/1990 | Sekiguchi et al. | 439/701 |
| 4,961,712 A | * | 10/1990 | Schwenk et al. | 439/436 |
| 5,055,067 A | | 10/1991 | Field | 439/540 |
| 5,070,216 A | | 12/1991 | Thornton | 174/35 GC |
| 5,085,601 A | | 2/1992 | Buchter et al. | 439/660 |
| 5,099,396 A | | 3/1992 | Barz et al. | 361/424 |
| 5,161,997 A | | 11/1992 | Defibaugh et al. | 439/532 |
| 5,204,496 A | | 4/1993 | Boulay et al. | 174/35 GC |
| 5,266,053 A | | 11/1993 | Jamet et al. | 439/607 |
| 5,317,105 A | | 5/1994 | Weber | 174/35 GC |
| 5,364,293 A | | 11/1994 | Peterson | 439/620 |
| 5,496,185 A | | 3/1996 | Beak | 439/95 |
| 5,524,908 A | | 6/1996 | Reis | 277/233 |
| 5,534,662 A | | 7/1996 | Peacock et al. | 174/35 GC |
| 5,586,632 A | | 12/1996 | Bigley et al. | 196/69.41 |
| 5,685,739 A | * | 11/1997 | Davis et al. | 439/607 |
| 5,752,854 A | | 5/1998 | Capp et al. | 439/607 |
| 5,772,471 A | | 6/1998 | Buck | 439/607 |
| 5,959,244 A | * | 9/1999 | Mayer | 174/35 GC |
| 6,005,186 A | * | 12/1999 | Bachman | 174/35 R |

FOREIGN PATENT DOCUMENTS

| | | |
|---|---|---|
| DE | 297 09 695 U1 | 9/1997 |
| EP | 0 425 184 A2 | 5/1991 |
| EP | 0 863 581 A1 | 9/1998 |

* cited by examiner

*Primary Examiner*—Dean A. Reichard
*Assistant Examiner*—Carmelo Oliva
(74) *Attorney, Agent, or Firm*—Woodcock Washburn LLP

(57) ABSTRACT

The present invention is directed to a gasket for reducing electromagnetic emission from electronic equipment. The gasket is defined by a substantially rectangular body that includes one or more openings through which a portion of a connector, to which the gasket is mounted, may pass. The gasket includes a hook-shaped peripheral edge, a plurality of locating projections, a plurality of retaining clips, and tabs that are formed on opposing sides of the opening(s). The hook-shaped edge, locating projections and retaining clips are adapted to receive and secure a connector to the gasket, and the tabs are provide to make an electrical contact with the connector housing. Additionally, the gasket includes spring fingers for use in mounting the gasket to a bulkhead and for forming an electrical contact with the bulkhead.

21 Claims, 4 Drawing Sheets

ELECTROMAGNETIC INTERFERENCE SHIELDING GASKET

FIELD OF THE INVENTION

This invention relates to electromagnetic interference shielding, and more particularly to a gasket for shielding such interference.

BACKGROUND OF THE INVENTION

Electromagnetic interference (EMI) is a problem that is commonly encountered in the design and operation of electronic equipment. Standards have been set that limit the amount of allowable EMI emissions from electronic devices. To meet the emissions standards it is necessary to seal around doors, panels, and slots that hold expansion cards and connectors. This task is challenging in today's commercial environment because there is pressure to minimize the spacing between slots and openings in order to increase the density of connection points to a particular piece of electronic equipment.

EMI containment problems have been exacerbated as processing speeds of electronic equipment have increased because EMI can cause electronic equipment to malfunction or not function at all. For example, contemporary electronic communications equipment operate at very high frequencies and equipment packaging attempts to concentrate a relatively large amount of circuitry per frame of equipment. Each frame tends to act as a transmitting source of EMI to the environment and more so as frequencies become higher (i.e., wavelengths become smaller).

In the majority of cases, the solution to the problem consists of enclosing the frames of equipment in a properly grounded metal box. These metal boxes usually comprise a metal frame on which metal panels may be removably secured to allow access to the equipment on the frame. In order to provide adequate EMI shielding, the mating surfaces of these panels must be electrically connected together. This is usually achieved through the use of an EMI gasket which provides an interface between mating conductive surfaces. The gasket should provide high conductivity to ensure DC continuity between mating surfaces and is usually compressible.

One known gasket is made from conductive rubber, which is inserted into a channel between two mating surfaces. Alternatively, the gasket may be glued to the inside of the channel. In such an arrangement, the channel is used to give the gasket lateral stability and to prevent its misalignment which could result through repeated removal and replacement of the panels. Another method of shielding box panels is through the use of a metallized compressible gasket attached to a metal band along its length. The metal band is secured to one of the mating surfaces so that the gasket is sandwiched between the mating surfaces when a panel is attached to the frame.

Another example of an EMI shield is illustrated in U.S. Pat. No. 5,161,997, to Defibaugh et al. The Defibaugh et al. EMI shield has opposed edges formed into a pair connector receiving of channels. The lower channel of the shield receives a connector, which is secured to the shield by rotating the connector toward the shield such that a rear face of the shield contacts front face of the connector. Next, an extending upper tab of the shield is bent over an upper edge of the connector, forming an upper channel, to secure the connector to the shield. While the Defibaugh et al. is disclosed as being a "hardwareless" connector (i.e., it may be mounted without additional hardware), it requires secondary tooling to form the upper channel after connector insertion.

These methods of EMI control are fully operable for their intended purpose. However, there still remains a need for an improved EMI shield that allows for higher densities of connection points to electronic equipment, and that is capable of providing an adequate level of protection against emissions. Further, there is a need for a shielding gasket that provides for easy mounting to connectors without requiring additional tooling or hardware. The present invention provides such a solution.

SUMMARY OF THE INVENTION

The present invention is directed to a gasket for reducing electromagnetic emission from electronic equipment. The gasket is defined by a substantially rectangular body that includes one or more openings through which a portion of a connector, to which the gasket is mounted, may pass. The gasket includes a hook-shaped peripheral edge, a plurality of projections, a plurality of retaining clips, and tabs that are formed on opposing sides the opening(s). The hook-shaped edge, projections and retaining clips are adapted to receive and secure a connector to the gasket, and the tabs are provide to make an electrical contact with the connector housing. The clips and projections may engage the holes provided in the connector flange to enhance the integrity of the system. Additionally, the gasket includes spring fingers for use in mounting the gasket to a bulkhead and for forming an electrical contact with the bulkhead. The spring fingers provide for additional points of contact.

The above-noted structure of the gasket of the present invention further provides for easy attachment of connectors to the gasket without the use of additional mounting hardware.

Other features and aspects will be described herein.

BRIEF DESCRIPTION OF THE DRAWINGS

The foregoing summary, as well as the following detailed description of the preferred embodiments, is better understood when read in conjunction with the appended drawings. For the purpose of illustrating the invention, there is shown in the drawings an embodiment that is presently preferred, in which like references numerals represent similar parts throughout the several views of the drawings, it being understood, however, that the invention is not limited to the specific methods and instrumentalities disclosed. In the drawings.

DETAILED DESCRIPTION OF THE PREFERRED EMBODIMENTS

The present invention is directed to novel electromagnetic interference (EMI) gasket that may be advantageously mounted to a connector without requiring additional mounting hardware.

Referring to FIGS. 1, 2, 5 and 6 there is illustrated an exemplary EMI gasket 10 in accordance with a first embodiment of the present invention and a connector 38 to which the EMI gasket 10 of the present invention may be secured. One such connector is part number 73465 available from FCI/Berg Electronics. It is noted that the present invention is in no way limited by the physical and electrical structure and features of connector 38, as the connector 38 is being presented merely for exemplary purposes.

Figure 1:
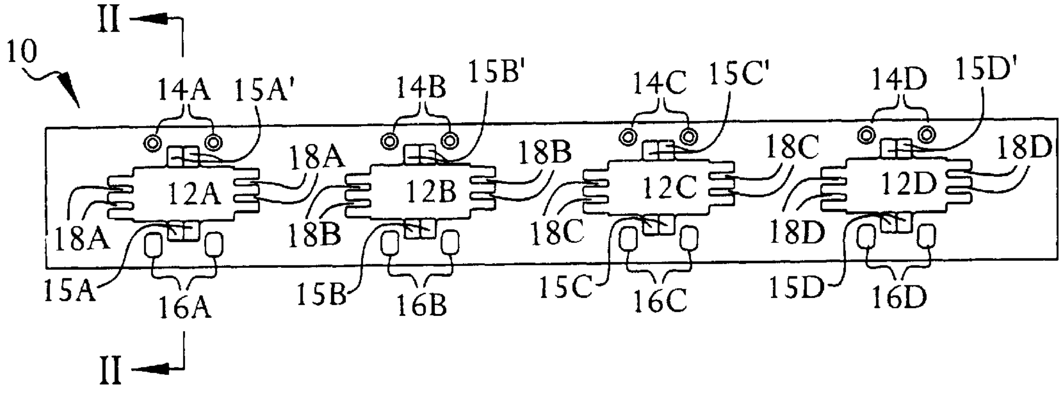
FIG. 1 is a front view of an embodiment of an EMI gasket in accordance with the present invention.

Referring to FIG. 1, the substantially rectangular gasket 10 can include four openings 12A–12D and is preferably comprised of a plated 0.006/0.010 Phros Bronze strip.

Each opening 12A–12D has associated therewith locating structure (such as projections or bumps 14A–14D), fingers 15A–15D, retaining clips 16A–16D, and tabs 18A–18D. The openings 12A–12D are provided such that a portion of a connector 38 may be aligned therewith. It is also noted that although four openings 12A–12D are illustrated in the exemplary gasket 10 of FIG. 1, additional or fewer openings may be provided in accordance with the requirements of a particular application.

Figure 2:
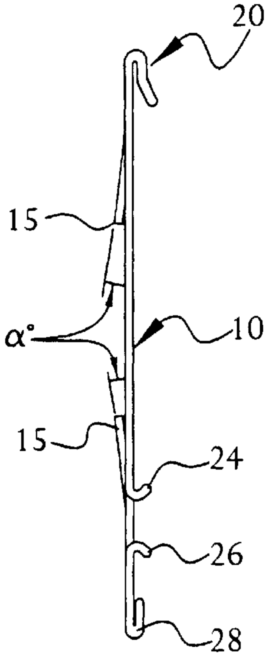
FIG. 2 is a cross sectional view taken along line II—II of FIG. 1.
Figure 3:
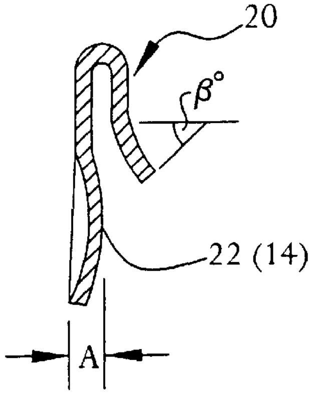
FIG. 3 is an enlarged cross sectional view of an upper portion of the EMI gasket of FIG. 2.
Figure 4:
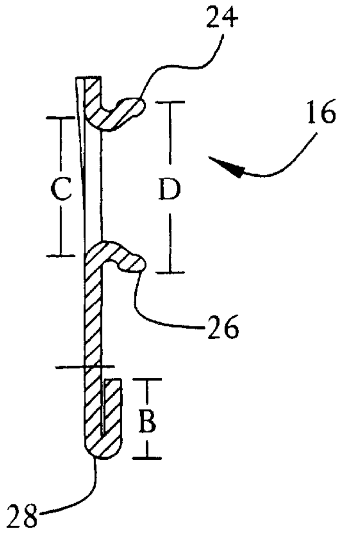
FIG. 4 is an enlarged cross sectional view of a lower portion of the EMI gasket of FIG. 2.

Referring now to FIGS. 2–4, additional details of the gasket 10 will now be described. The gasket 10 includes a hooked end 20, which forms a channel to engage the connector housing 40 (upper flange 48) when the gasket 10 is secured to the connector 38. The size of the channel formed by the hooked end 20 is preferably such that the upper flange 48 of connector housing 40 may be fitted there between (e.g., approximately 0.76 mm). As shown in FIG. 3, the channel 20 curves outward toward the rear of the gasket 10 such that an end thereof forms an angle β with respect to the horizontal, which is preferably 45°. The curved end acts as a lead-in surface to guide housing 40 into channel 20.

Referring again to FIG. 1, locating projections 14A–14D and retaining clips 16A–16D are associated with each opening 12A–12D. Preferably, each opening 12A–12D has a pair of locating projections 14A–14D and a pair of retaining clips 16A–16D. The locating projections 14A–14D are received within a first pair of circular openings 46 in the connector 38 to position the connector 38 with respect to the opening 12A–12D. The retaining clips 16A–16D are received by a second pair of circular openings 44 in the connector 38 to secure one portion of the connector 38 to the gasket 10. In order to facilitate assembly of connector 38 and gasket 10, clips 16A–16D secure the lower portion of connector 38 while channel 20 receives the upper portion of connector 38.

The fingers 15A–15D are provided to form an electrical contact with a bulkhead (not shown) to which the gasket 10 and connector 38 may be mounted. The fingers 15A–15D are provided at the top and bottom of their respective openings 12A–12D, and are angled toward the front of the gasket 10 at an angle α. The angled fingers 15A–15D ensure a good electrical contact between the fingers 15A–15D and the bulkhead. In addition, the fingers 15A–15D create a biasing force when the gasket 10 is mounted to the bulkhead to aid in maintaining the gasket 10 in position. Preferably, the angle a is between approximately 8° and 10°. The openings 12A–12D may optionally allow spring fingers (not shown) provided on the connector 38 to pass therethrough to make contact with a bulkhead (not shown) to which the connectors 38 are to be mounted.

The tabs 18A–18D are provided to form an electrical contact with the connector housing 40. As shown in FIG. 1, the tabs 18A–18D are provided on each side of their respective opening 12A–12D. It is preferable that the tabs 18A–18D on one side of the opening be offset with respect to the tabs 18A–18D other side of the opening and a center line of the opening such that the tabs 18A–18D interdigitate with and contact corresponding tabs 42 provided on the connector housing 40 when the gasket 10 is mounted to the connector 38.

Also shown in FIG. 3 projection 14 has a diameter that is approximately that of the first circular openings 46 in the connector housing 40. In the exemplary connector 38, the first circular openings 46 have a diameter of 2.44 mm, thus it is preferable for the diameter of the projection 14 to be approximately 2.4 mm. In addition, the housing 40 preferably has a thickness of 0.305 mm, therefore, it is preferable that the projection 14 extend approximately 0.42 mm from the remainder of the gasket 10. As such, the projection 14 will seat within the first circular openings 46 of the connector housing 40 to properly align the connector 38 with respect to the opening 12 in the gasket 10.

The retaining clips 16A–16D are shown in greater detail in FIG. 4. Each retaining clip 16 includes a pair of hooks 24 and 26 that are adapted to engage opposed sides of the second circular openings 44 of the connector 38. For example, if the exemplary connector 38 has second circular openings 44 having a diameter of 2.44 mm, the retaining clips 16 are preferably formed having an opening height C of approximately 2.1 mm, a radius of curvature of approximately 0.35 mm, and a distance D between hooks 24 and 26 of 2.5 mm. Such dimensions will allow the hooks 24 and 26 to deflect upon insertion into the second openings 44 and to return to their original position to clasp the connector 38 to the gasket 10.

Also shown in FIG. 4, the gasket 10 can have a lower end 28 that is rigified by bending a length B of the gasket material back onto itself, wherein the length B is preferably approximately 1.22 mm. The lower end 28 may be used as a ledge to locate the lower flanges 50 and 52 of the connector 38, and optionally, locking the gasket 10 to the connector 38.

Figure 5:
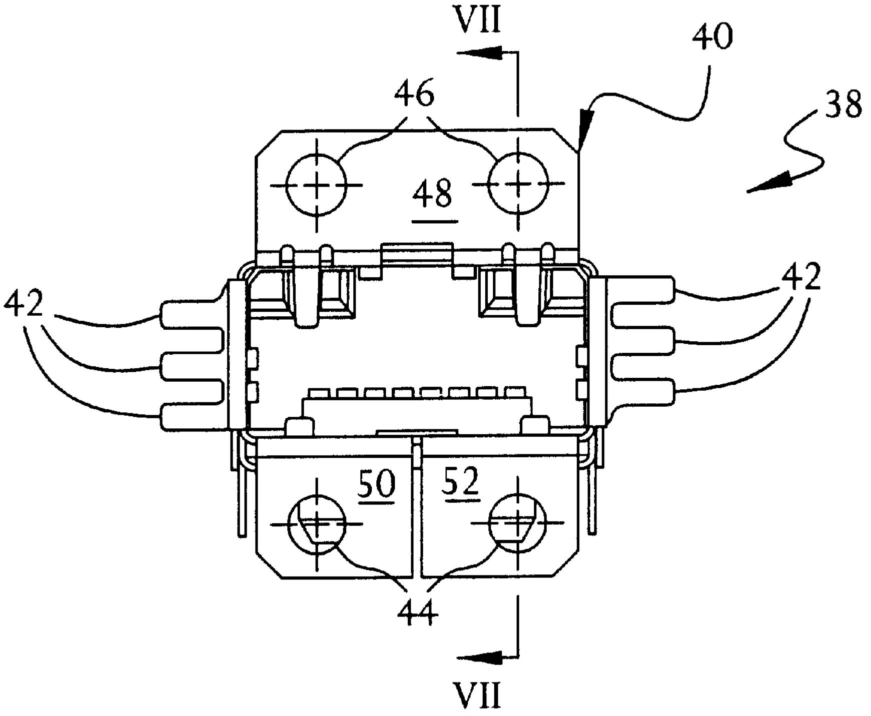
FIGS. 5 and 6 are front and side views of an exemplary connector to which the EMI gasket of the present invention may be mounted.
Figure 6:
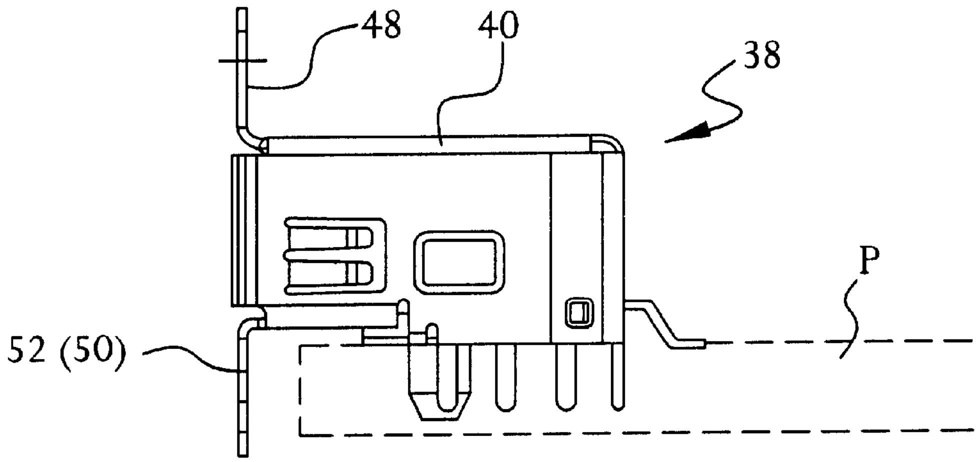
Figure 7:
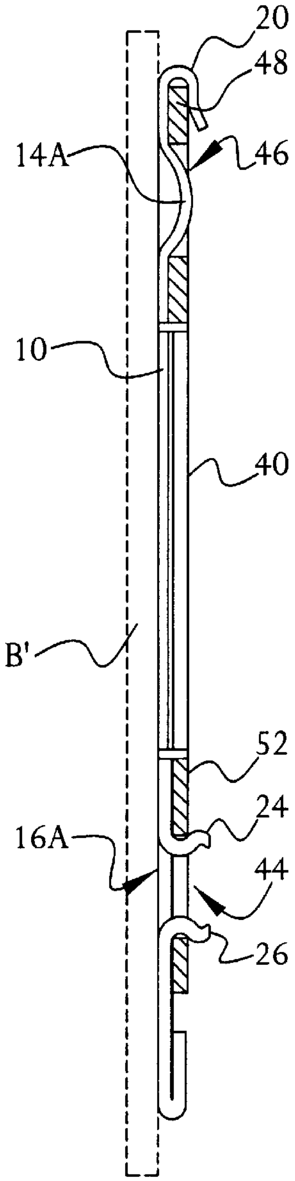
FIG. 7 is a cross section view taken along line VII—VII of FIG. 5, which additionally shows the EMI gasket partially secured to the exemplary connector.
Figure 8:
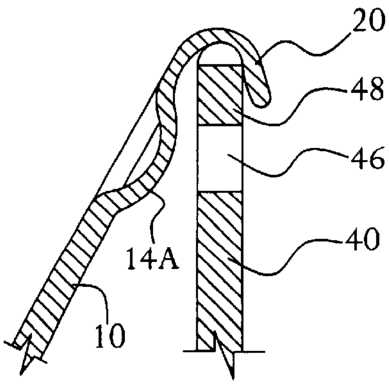
FIG. 8 is a cross section view taken along line VII—VII of FIG. 5, which additionally shows the EMI gasket secured to the exemplary connector.

The attachment of the EMI gasket 10 to the connector 38 will now be described with reference to FIGS. 7 and 8, which illustrate a cross section view taken along line VII—VII of FIG. 5 and a side view of an EMI gasket 10 partially secured thereto (FIG. 7) and completely secured thereto (FIG. 8). The present invention provides an advantageous structure and method by which the gasket 10 may be secured to the connector 38 without requiring additional mounting hardware. Also, the connector is typically secured to a printed circuit board P (see FIG. 6) before mounting the gasket 10 thereto. To mount the gasket 10 to the connector 38, the flange 48 of the connector 38 is first positioned within the gap formed by the channel 20. Then, the gasket 10 can be slid along the connector 38 to align the projections 14 with the openings 46. Next, the bottom of the gasket 10 is rotated toward the connector 38 to seat the locating projections 14A seat within the first circular openings 46 and to position the connector 38 with respect to the gasket 10. Next, the pair of hooks 24 and 26 of the retaining clips 16A are inserted into the second circular openings 44 to secure the gasket 10 to the connector 38. As noted above, once the gasket 10 is mounted to the connector 38, the tabs 18A contact the tabs 42, creating addition points of electrical contact between the gasket 10 and the connector housing 40. After combining the gasket 10 and the connector 38, the unit is placed adjacent a bulkhead B' (see FIG. 7). The fingers 15A are formed such that they create an electrical connection between the bulkhead and the gasket 10.

The above-described gasket of the present invention provides a novel structure by which connectors may be quickly secured thereto, while simultaneously providing effective shielding for high density applications due to the many points of electrical contact between the gasket and the connector, and the gasket and the bulkhead.

Figure 9:
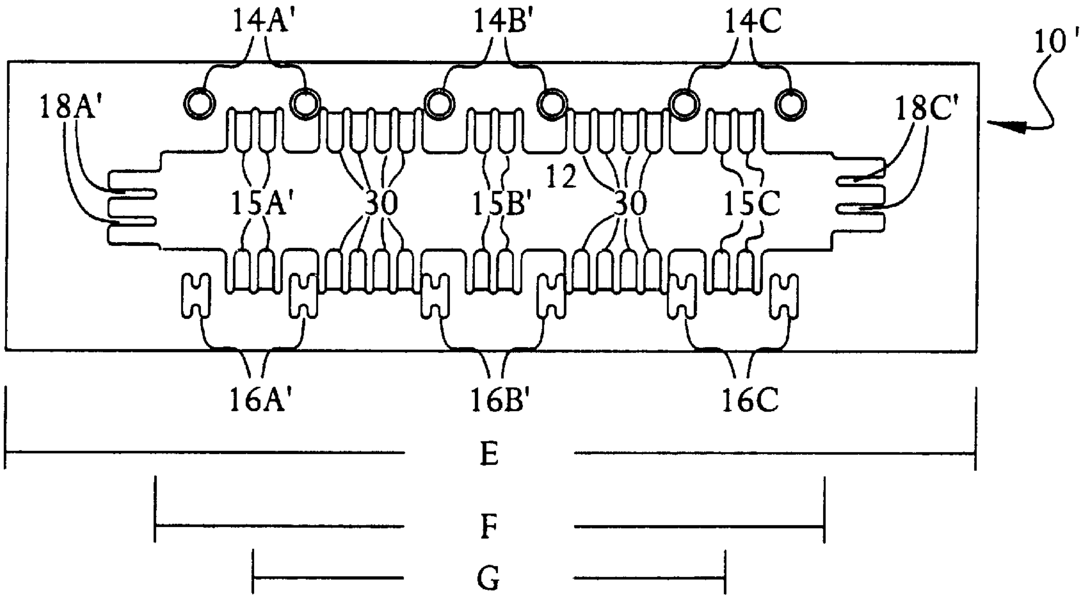
FIG. 9 is a front view of another embodiment of the EMI gasket of the present invention.

FIG. 9 illustrates a second embodiment of the EMI gasket 10' of the present invention. Similar elements to those of FIG. 1 are identified by reference numerals have a prime "'" appended thereto. Accordingly, these elements will not be described in detail herein again. In addition, the gasket 10' includes similar structure to that shown in FIGS. 2–4 to provide for connector mounting and electrical contacts. The embodiment of FIG. 9 is preferably used when minimum side-by-side stacking distance is desired.

As illustrated in FIG. 9, a single opening 12 is provided to accommodate several of the connectors 38, rather than the individual openings 12A–12D of FIG. 1. Connectors mounted to the gasket 10' are aligned between each of the pairs of locating projections 14A'–14C' and the retaining clips 16A'–16C'. Thus, the gasket 10' provides for an open space between connectors. As is evident from FIG. 9, tabs 18A' and 18C' will only mate with the tabs 42 of the outmost connectors to which the gasket 10' is mounted (i.e, those connectors 38 mounted to locating projections 14A' and the retaining clips 16A' and locating projections 14C' and the retaining clips 16C'). The gasket 10' also is provided with extra fingers 30 that create additional points of electrical contact between the gasket 10' and the bulkhead to which the gasket 10' is mounted. The extra fingers 30 may be formed having an angle a (e.g., 8–10°) with respect to the front face of the gasket 10' to ensure a good electrical contact between the fingers 30 and the bulkhead.

The gasket 10' advantageously provides a structure such that connectors 38 ay be more closely spaced, as well as a structure that is adaptable to provide mounting positions to accommodate a varying numbers of connectors, e.g, one to eight (or more) positions. A variable number of positions may be provided by varying the dimensions (in mm) such as those labeled "E," "F," and "G" in FIG. 9 in accordance with Table 1 below.

As seen in FIG. 9, dimension "E" represents the total length of the gasket 10, dimension "F" represents the length of the opening 12, and dimension "G" represents the distance between the centerline of the first and last connectors 38 mounted to the gasket 10.

TABLE 1

| Number of Positions | Dimension "E" | Dimension "F" | Dimension "G" |
|---|---|---|---|
| One | 40.00 | 15.20 | NA |
| Two | 50.00 | 35.20 | 20.00 |
| Three (e.g., FIG. 9) | 80.00 | 55.20 | 40.00 |
| Four | 100.00 | 15.20 | 60.00 |
| Five | 120.00 | 95.20 | 80.00 |
| Six | 140.00 | 115.20 | 100.00 |
| Seven | 160.00 | 135.20 | 120.00 |
| Eight | 180.00 | 155.20 | 140.00 |

TABLE 1

The present invention may be employed in other specific forms without departing from the spirit or essential attributes thereof. For example, the gasket 10' maybe adapted such that connectors may be provided within the space between the connectors mounted between each of the pairs of projections 14A'–14C' and the retaining clips 16A'–16C'. While the invention has been described and illustrated with reference to specific embodiments, those skilled in the art will recognize that modification and variations may be made without departing from the principles of the invention as described herein above and set forth in the following claims.

What is claimed:

1. A gasket for shielding electronic equipment from electromagnetic interference, comprising:

a body having a first edge, a second edge and at least one opening between said edges;

a channel formed between said at least one opening and said first edge; and a retainer formed between said at least one opening and said second edge, said retainer comprising retaining clips for coupling said gasket to said electronic equipment, wherein some of said retaining clips have opposing curved portions.

2. The gasket as recited in claim 1, further comprising conductive tabs formed on opposing sides of said at least one opening.

3. The gasket as recited in claim 1, further comprising fingers formed on opposing sides of said at least one opening.

4. The gasket as recited in claim 3, wherein said fingers are angled such that said fingers extend forwardly from said body.

5. The gasket as recited in claim 1, further comprising structure between said at least one opening and said channel.

6. The gasket as recited in claim 5, said structure defining a curved region that extends rearwardly from said body.

7. The gasket as recited in claim 1, wherein said channel is formed by bending said first edge.

8. The gasket as recited in claim 1, further comprising an increased rigidity area.

9. The gasket as recited in claim 8, wherein said increased rigidity area comprises a lower end that is formed by bending a length of said body back onto itself.

10. The gasket as recited in claim 1, wherein said at least one opening comprises a plurality of openings.

11. The gasket as recited in claim 10, wherein each of said plurality of openings have a corresponding retainer.

12. An EMI gasket for receiving a connector, the connector including a housing having flanges comprising at least one aperture for mounting said gasket to the connector, the housing further including electrically conductive tabs that are adapted to mate with said gasket, said gasket comprising:

a body having a first edge, a second edge and at least one opening there between and sized to accept the connector;

a channel between said opening and said first edge adapted to receive one of the flanges of the connector;

a projection between said at least one opening and said channel and adapted to be received by the aperture formed on one of the flanges;

a retainer between said opening and said second edge adapted to be received by the aperture in the other of said flange of the connector, said retainer comprises a plurality of retaining clips for engaging opposite sides of said aperture of said flanges; and conductive tabs formed on opposing sides of said at least one opening to contact the electrically conductive tabs of the connector.

13. The EMI gasket as recited in claim 12, further comprising fingers formed on upper and lower sides of said at least one opening.

14. The EMI gasket as recited in claim 13, wherein said fingers are angled such that said fingers extend forwardly from said body.

15. The EMI gasket as recited in claim 12, further comprising an increased rigidity area.

16. The EMI gasket as recited in claim 15, wherein said increased rigidity area comprises a lower end that is formed by bending a length of said body back onto itself.

17. A method of shielding electronic equipment from electromagnetic interference, comprising the steps of:

providing a circuit substrate;

providing an electrical connector having a first and second flange;

mounting said connector to said circuit substrate;

providing a gasket, said gasket comprising a first edge, a second edge, an opening between said edges, a channel between said opening and said first edge and a retainer between said opening and said second edge, wherein said retainer comprises retaining clips, some of said retaining clips having opposing curved portions;

inserting said first flange into said channel; and engaging said second flange with said retainer.

18. The method as recited in claim 17, wherein the mounting step occurs before the inserting step.

19. The method as recited in claim 17, further comprising the steps of:

providing a bulkhead; and engaging said bulkhead with said gasket.

20. The method as recited in claim 17, wherein the engaging step comprises the step of rotating said gasket.

21. The method as recited in claim 17, wherein said gasket includes a projection between said opening and said channel, one of said flanges of said connector includes an aperture, and further comprising the step of aligning said projection with said aperture.

* * * * *